(12) United States Patent
Hallam et al.

(10) Patent No.: US 11,588,071 B2
(45) Date of Patent: Feb. 21, 2023

(54) METHOD FOR IMPROVING THE PERFORMANCE OF A HETEROJUNCTION SOLAR CELL

(71) Applicant: NewSouth Innovations Pty Limited, Sydney (AU)

(72) Inventors: Brett Hallam, Sydney (AU); Matthew Wright, Sydney (AU); Moonyong Kim, Sydney (AU); Daniel Chen, Sydney (AU)

(73) Assignee: NewSouth Innovations Pty Limited, Sydney (AU)

( * ) Notice: Subject to any disclaimer, the term of this patent is extended or adjusted under 35 U.S.C. 154(b) by 110 days.

(21) Appl. No.: 17/287,966

(22) PCT Filed: Oct. 24, 2019

(86) PCT No.: PCT/AU2019/051168
§ 371 (c)(1),
(2) Date: Apr. 22, 2021

(87) PCT Pub. No.: WO2020/082131
PCT Pub. Date: Apr. 30, 2020

(65) Prior Publication Data
US 2021/0376183 A1 Dec. 2, 2021

(30) Foreign Application Priority Data
Oct. 24, 2018 (AU) ................ 2018904042

(51) Int. Cl.
*H01L 31/20* (2006.01)
*H01L 31/0745* (2012.01)

(52) U.S. Cl.
CPC ........ *H01L 31/208* (2013.01); *H01L 31/0745* (2013.01)

(58) Field of Classification Search
CPC .... H01L 31/18; H01L 31/208; H01L 31/0745
See application file for complete search history.

(56) References Cited

U.S. PATENT DOCUMENTS

| 2006/0283496 A1 | 12/2006 | Okamoto et al. |
| 2010/0243041 A1 | 9/2010 | Carlson et al. |

(Continued)

FOREIGN PATENT DOCUMENTS

| CN | 102299206 B | 12/2011 |
| CN | 103650170 B | 3/2014 |

(Continued)

OTHER PUBLICATIONS

International Search Report and Written Opinion issued in application No. PCT/AU2019/051168, dated Dec. 5, 2019.

*Primary Examiner* — Mayla Gonzalez Ramos
(74) *Attorney, Agent, or Firm* — Knobb Martens Olson & Bear, LLP

(57) ABSTRACT

The present disclosure provides a method for rapidly treating a heterojunction solar cell fabricated using a crystalline silicon wafer doped exclusively with n-type dopants to improve surface passivation and carrier transport properties using the following steps: providing a heterojunction solar cell; the solar cell having an n-type silicon substrate exclusively doped with n-type dopants with a concentration higher than $1 \times 10^{14}$ cm$^{-3}$ and a plurality of metallic contacts; illuminating a surface portion of the solar cell for a period of less than 5 minutes and at a temperature between 200° C. and 300° C. with light having an intensity of at least 2 kW/m$^2$ and a wavelength such that the light is absorbed by the surface portion and generates electron-hole pairs in the solar cell. The step of illuminating a surface portion of the solar cell is such that less than 0.5 kWh/m$^2$ of energy is transferred to the surface portion and a temperature of the (Continued)

surface portion increases at a rate of at least 10° C./s for a period of time during illumination.

20 Claims, 10 Drawing Sheets

(56) References Cited

U.S. PATENT DOCUMENTS

| | | |
|---|---|---|
| 2011/0203648 A1 | 8/2011 | Carey et al. |
| 2015/0013758 A1* | 1/2015 | Harrison ............ H01L 31/1864 |
| | | 438/72 |
| 2015/0364351 A1* | 12/2015 | Lee .................... H01L 31/1864 |
| | | 219/388 |
| 2017/0062633 A1 | 3/2017 | Carlson et al. |

FOREIGN PATENT DOCUMENTS

| | | |
|---|---|---|
| CN | 106601861 A | 4/2016 |
| CN | 110416357 | 11/2019 |
| CN | 110459651 | 11/2019 |
| CN | 108963005 A | 1/2021 |
| WO | WO 2017042486 A1 | 3/2017 |
| WO | WO 2017064383 A1 | 4/2017 |
| WO | WO 2017064384 A1 | 4/2017 |
| WO | WO 2021018757 | 2/2021 |

* cited by examiner

METHOD FOR IMPROVING THE PERFORMANCE OF A HETEROJUNCTION SOLAR CELL

The present application is a U.S. National Phase Application of PCT International Application No. PCT/AU2019/051168 filed on Oct. 24, 2019, and entitled "METHOD FOR IMPROVING THE PERFORMANCE OF A HETEROJUNCTION SOLAR CELL," which claims priority from Australian Patent Application No. 2018904042 filed on Oct. 24, 2018, the contents of each are incorporated herein by reference.

TECHNICAL FIELD

The present technology relates to a method for improving the performance of a heterojunction solar cell, in particular, the present technology relates to a method for improving passivation of an n-type heterojunction solar cell.

BACKGROUND

Heterojunction solar cells are typically formed by creating a junction between crystalline and hydrogenated amorphous silicon layers at low temperatures. This is in contrast to conventional solar cells, where a thermal diffusion is performed to create a doped silicon region of the opposite polarity to that of the wafer.

The heterojunction solar cell structure uses stacks of intrinsic and doped hydrogenated amorphous silicon to provide excellent surface passivation on both surfaces of the device. To gain the benefits of the excellent surface passivation, these solar cells require high bulk lifetimes and hence, are fabricated using a high-lifetime n-type wafers, free from p-type dopants.

In this specification 'n-type wafers' means wafers doped exclusively with n-type dopants having only trace concentrations of p-type dopants with a concentration of less than $1 \times 10^{12}/cm^3$. The absence of p-type dopants, in particular boron dopants, reduces light-induced degradation mechanisms related to the boron-oxygen defect.

One of the key challenges for heterojunction solar cells is that the layers of amorphous silicon and the overlying transparent conductive oxide (TCO) layer typically degrade when annealed at temperatures above 200° C. This is well documented in the literature. As a result, after the formation of the heterojunction structure, annealing above 200° C. should be avoided to minimise degradation to the surface passivation and TCO properties.

The restriction to such low temperatures also leads to relatively high resistances for the metal contacts, particularly when using pastes deposited using techniques such as screen-printing.

SUMMARY

In accordance with the first aspect, the present invention provides, a method for improving the performance of an n-type heterojunction solar cell comprising:

providing a heterojunction solar cell; the solar cell having an n-type silicon substrate exclusively doped with n-type dopants with a concentration higher than $1 \times 10^{14}$ cm$^{-3}$ and a plurality of metallic contacts;

illuminating a surface portion of the solar cell for a period of less than 5 minutes and at a temperature between 200° C. and 300° C. with light having an intensity of at least 2 kW/m$^2$ and a wavelength such that the light is absorbed by the surface portion and generates electron-hole pairs in the solar cell;

wherein the step of illuminating a surface portion of the solar cell is such that less than 0.5 kWh/m$^2$ of energy is transferred to the surface portion and a temperature of the surface portion increases at a rate of at least 10° C./s for a period of time during illumination.

In an embodiment, the step of illuminating a surface portion of the solar cell with light is such that an excess carrier concentration within the solar cell is at least $1 \times 10^{16}$ cm$^{-3}$ during illumination.

In an embodiment, the wavelength of the light is such that absorption in the plurality of metallic contacts is higher than absorption in the silicon substrate.

In an embodiment, the method further comprises varying the intensity of illumination to modulate the temperature of the device.

In an embodiment, the step of illuminating a surface portion of the solar cell is performed so that the exposed portion is rapidly heated to a pre-determined temperature by using a higher illumination intensity.

In an embodiment, the illumination intensity is higher than 5 kW/m$^2$ for less than 6 minutes.

In an embodiment, the illumination intensity is higher than 20 kW/m$^2$ for less than 90 seconds.

In an embodiment, the illumination intensity is higher than 100 kW/m$^2$ for less than 18 seconds.

In an embodiment, the illumination intensity is higher than 200 kW/m$^2$ for less than 9 seconds.

In an embodiment, the illumination intensity is higher than 50 kW/m$^2$ for a period of time between 0.1 seconds and 9 seconds.

In an embodiment, the wavelength of the light is between 700 nm and 1100 nm or between 800 nm and 1000 nm.

In an embodiment, the method further comprises actively cooling the solar cell during illumination when the illumination intensity is above 4 kW/m$^2$.

In an embodiment, the method further comprises actively cooling the solar cell from a temperature in the range of 200° C.-300° C. to a temperature at least 50° C. lower with a cooling rate of at least 10° C./s.

In an embodiment, the solar cell is cooled with a cooling rate of at least 20° C./s.

In an embodiment, the solar cell is cooled to a temperature below 150° C.

In an embodiment, the method further comprises pre-heating the device to a temperature of at least 100° C. using infra-red light.

In an embodiment, the step of illuminating a surface portion of the solar cell is performed at a temperature of 210° C.-295° C.

In an embodiment, the step of illuminating a surface portion of the solar cell is performed at a temperature of 220° C.-290° C.

In an embodiment, the step of illuminating a surface portion of the solar cell is performed at a temperature of 230° C.-280° C.

In an embodiment, the step of illuminating a surface portion of the solar cell is performed at a temperature of 240° C.-270° C.

In an embodiment, the illuminated portion has an area of more than 10 cm$^2$.

In an embodiment, the illuminated portion has an area of more than 100 cm$^2$.

In an embodiment, the illuminated portion comprises a rear surface of the device.

In an embodiment, the illuminated portion comprises a rear and a front surface of the device.

In an embodiment, the step of illuminating a surface portion of the solar cell with light is performed at a temperature above 250° C. for a duration of less than 30 seconds.

In an embodiment, the step of illuminating a surface portion of the solar cell with light is performed at a temperature above 250° C. for a duration of less than 10 seconds.

BRIEF DESCRIPTION OF THE DRAWINGS

Notwithstanding any other forms which may fall within the scope of the present invention, to make the technology more clearly understood, an embodiment of the technology will now be described, by way of example only, with reference to the accompanying drawings in which.

DETAILED DESCRIPTION OF EMBODIMENTS

Figure 1:
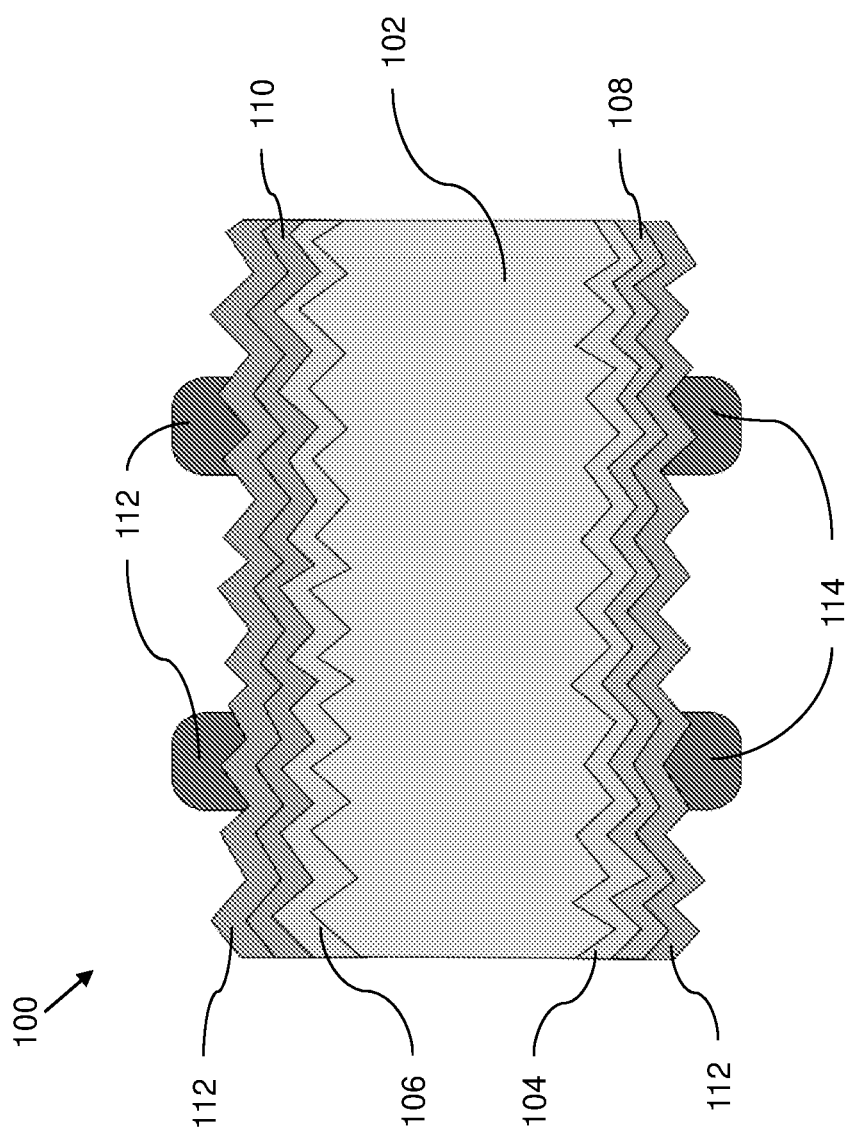
FIG. 1 shows a schematic of a heterojunction solar cell.

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure.

Referring now to FIG. 1 there is shown a schematic 100 of a heterojunction solar cell in line with the current state of the art. The solar cell is built around a high-lifetime n-type silicon wafer 102. Two intrinsic amorphous silicon layers with a thickness up to 20 nm are formed on the rear 104 and front 106 side portions of silicon wafer 102. These layers provide excellent surface passivation on both the front and the rear of the solar cell and must be sufficiently thin to allow the tunneling of charge carriers towards the solar cell contacts.

An n-type doped hydrogenated amorphous silicon layer 108 with a thickness up to 30 nm is formed on the rear of the cell 100 over intrinsic layer 104 and a p-type doped hydrogenated amorphous silicon layer 110 with a thickness up to 30 nm is formed on the front of the cell 100 over intrinsic layer 106. The p-doped hydrogenated amorphous silicon layer 110 provides band-bending and creates an effective junction for the cell 100 whilst the n-doped hydrogenated amorphous silicon layer 108 provides an ohmic contact.

Generally, the hydrogenated amorphous silicon layers 108, 110 are grown at a temperature of approximately 200° C.

Being extremely thin, the doped amorphous silicon layers 108, 110 lack lateral conductivity to effectively transport carriers to the metal electrodes 114. As a result, transparent conductive oxide layers (TCOs) 112 are deposited onto the p-type doped amorphous silicon 110 and n-type doped amorphous silicon 108. These TCO layers are often made using indium tin oxide (ITO) and also provide antireflection properties to the device to enhance the absorption of photons within the silicon wafer.

Once the effective junction is formed and TCO layers are deposited, metallic contacts 114 are formed on the front and rear surfaces of silicon wafer 102 to allow for extraction of charge carriers from the device. Contacts 114 can be made by screen-printing or plating of metals such as copper or silver. At least one of the metal electrodes is formed in a grid pattern to allow light to enter the solar cell. After deposition of the metal, the metal is cured for a short duration at a temperature typically below 200° C. For example, a leading industrial low-temperature metallisation paste for heterojunction solar cells (Solamet PV416 by Dupont) specifies an annealing condition of 130-180° C. for 5-60 min. Another leading paste by Hereaus (SOL560) specifies an annealing temperature of less than 200° C. Curing of the metal pastes may be performed in a belt furnace conveyor.

Generally, it has been shown that annealing processes can degrade the properties of amorphous silicon layers. This is particularly true for annealing processes where illumination is involved/required. Loss of hydrogen and the Staebler-Wronski effect has been found to be one of the reasons for deterioration. Low temperature processing also allows avoiding thermal stresses for the cells.

Annealing processes that involve illumination have been investigated in recent years to stabilise the performance of p-type Cz-silicon materials and solar cells. However, it has been shown that n-type solar cells do not benefit from such annealing processes as they do not suffer from instabilities due to light-induced degradation.

Recently it has been shown that an illuminated annealing process performed at a temperature between 20° C.-200° C. for periods of up to 48 hours may lead to improvements in the open circuit voltage of a heterojunction solar cell. However, at the same time, it has been suggested that temperatures above 200° C. should be not be used to avoid a deterioration of the amorphous silicon layers and illumination intensities should be limited to avoid heating of the sample to above 200° C., particularly when using an additional heating source.

The present disclosure provides a methodology to improve the performance of a heterojunction solar cell by employing an illuminated annealing step at a temperature above 200° C. in specific conditions. The skilled person would appreciate that such methodology could also be applied to other types of solar cell structures that are substantially based on the well-established heterojunction solar cell structure shown in FIG. 1.

For example, either the light receiving surface of the cell may be the n-type or p-type side of the cell and illumination during annealing may be provided on the light receiving surface (front) of the cell or the rear side of the cell.

Another alternative would be to form both the n-type and p-type contacts on the same surface of the solar cell, in an interdigitated manner, whereby alternative regions have doped n-type and doped p-type amorphous silicon on the rear surface of the solar cell. In such a structure, appropriate modifications to the remainder of the process sequence can be made to avoid shunting between the n-type and p-type contacts, such as patterning the transparent conductive oxide layer. In this instance, appropriate changes to the front surface of the solar cell can include using a passivating dielectric stack such as a thin layer of amorphous silicon or silicon dioxide, capped by a hydrogen containing antireflection coating such as silicon nitride.

Figure 2:
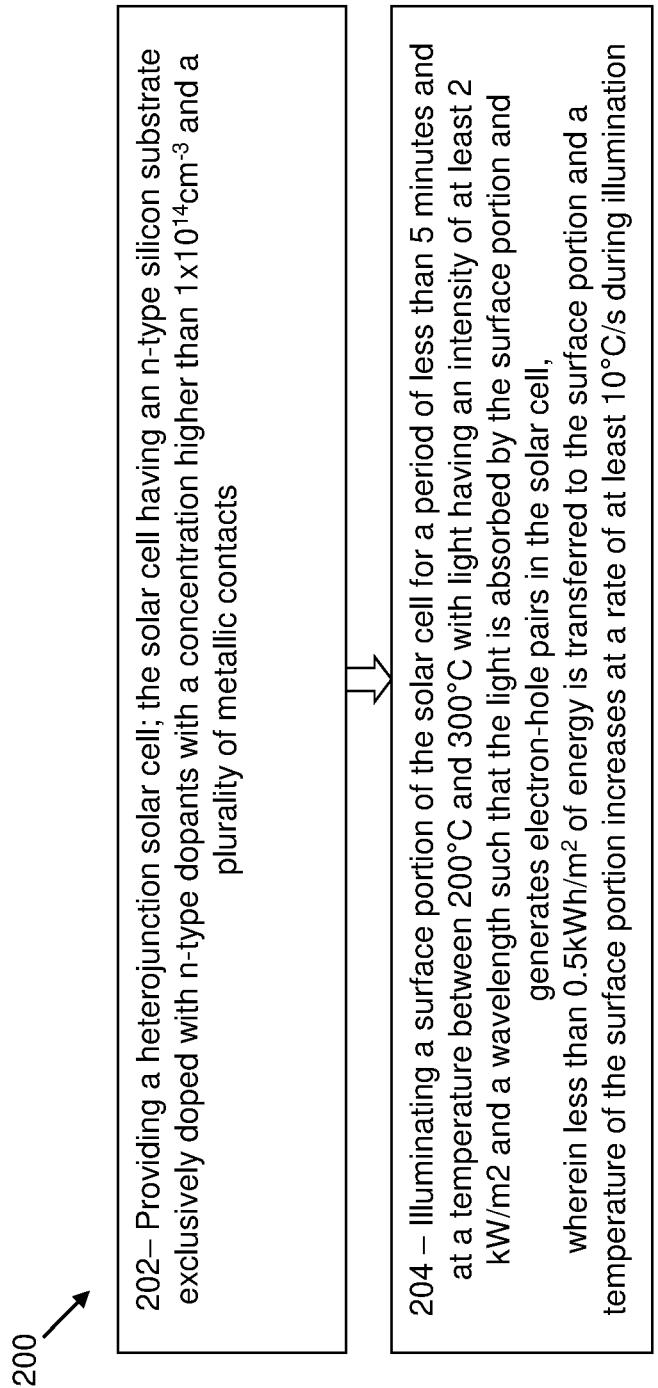
FIG. 2 shows a flow diagram outlining method steps to improve the performance of a heterojunction solar cell.

Referring now to FIG. 2, there is shown a flow diagram 200 with method steps used to perform a method for improving the performance of a n-type heterojunction solar cell. At step 202, a heterojunction solar cell comprising a metallisation layer is provided. The solar cell being fabricated using an n-type silicon substrate exclusively doped with n-type dopants with a concentration higher of $1\times10^{14}$ $cm^{-3}$. At step 204 a surface portion of the solar cell is illuminated with light; the light having an intensity of at least 2 $kW/m^2$ and a wavelength such that the light is absorbed by the surface portion and generates electron-hole pairs in the solar cell. The illumination step is controlled to provide less than 0.5 $kWh/m^2$ of energy to the illuminated portion while the solar cell is illuminated. The step of illuminating a surface portion of the solar cell is performed for less than 5 minutes and at a temperature between 200° C. and 300° C. During illumination the temperature of the surface portion increases at a rate of at least 10 C/s.

Generally, the illuminated portion has an area of more than 10 $cm^2$ and more likely 100 $cm^2$. The step of illuminating a surface portion of the solar cell with light is performed so that the excess carrier concentration within the solar cell is at least $1\times10^{16}/cm^3$ during illumination. The light wavelengths may be selected so that absorption in the metal contacts is higher than in the silicon.

The illumination can be provided by a laser source or light emitting diodes and the temperature can be monitored using an optical sensor. The illumination intensity can be varied during the annealing process and the illumination may be used to rapidly heat the device to a pre-determined temperature and avoid heating of device above a critical temperature. Illumination may be also pulsed. Depending on the parameters of the solar cell, the illumination intensity may be higher than 5 $kW/m^2$ for less than 6 minutes; 20 $kW/m^2$ for less than 90 seconds; 100 $kW/m^2$ for less than 18 seconds, 200 $kW/m^2$ for less than 9 seconds or 50 $kW/m^2$ for a period of time between 0.1 seconds and 9 seconds.

In some instances, the solar cell is cooled so that its temperature drops from 200° C.-300° C. to a temperature at least 50° C. lower. The cooling can be realised by using a thermal mass in contact with the solar cell. The thermal mass can be put into contact with the cell after the removal of the illumination. In some alternative embodiments the thermal mass also provides heating to the wafer during the early stages of illumination or, alternatively, prior to illumination. In some embodiments, the thermal mass may be in contact with the solar cell during illumination to provide cooling for temperatures in the range of 200° C.-300° C. Air can also be blown across the surface of the solar cell for cooling. The cooling power can be modulated in this case by modulating the airflow. Cooling rates of 20° C./s or more can be achieved. The solar cell may be cooled to a temperature of below 150° C.

The solar cell can be pre-heated to at least 100° C. using infra-red light. For example, the step of illuminating a surface portion of the solar cell with light is performed at a temperature of 210° C.-295° C., 220° C.-290° C., 230° C.-280° C., 240° C.-270° C. The illuminated portion can be at the front or front and rear of the solar cell. Advantageously, illumination can be performed at a temperature of 250° C. for a duration of less than 30 seconds or less than 10 seconds.

The cell metal contacts are formed using a paste, for example by using a printing process. The annealing process described above can be used to cure the metal pastes and/or improve the conductivity of the metal contacts. Alternatively, the illuminated anneal can be performed after the curing of metal pastes at a higher temperature than used to cure the pastes and may also be used to improve the conductivity of the metal contacts.

Figure 3:
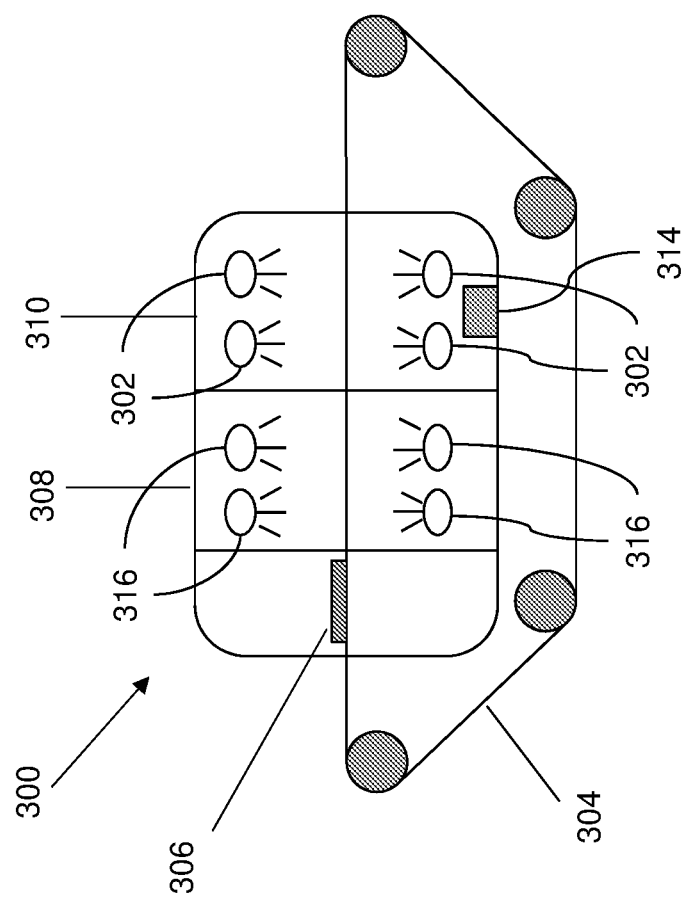
FIG. 3 shows a schematic representation of an apparatus used to perform the method of FIG. 2.

Referring now to FIG. 3, there is shown a belt-furnace conveyor 300 that employs LED light sources 302 to perform the method outlined in FIG. 2. The apparatus comprises a conveyor belt 304 that transports the heterojunction solar cells 306. Apparatus 300 may be part of a larger solar cells manufacturing line and be arranged to perform the final stages of manufacturing to improve the performance of the cells. The apparatus comprises a pre-heating section 308, an illumination/annealing section 310 a cooling element 314. The pre-heating section 308 comprises infra-red lamps 316 that allow increasing the temperature of the solar cell 306 to a temperature above 100° C. The LED lamps 302 in the illumination/annealing section 310 provide light with an intensity of at least 2 $kW/m^2$ that is absorbed by the solar cell 306 and generates electron-hole pairs in the solar cell 306. The power of the LED lamps 302 can be tuned in light with specific process requirements. In a similar way, the time spent by the cells in the illumination/annealing section 310 can be controlled by controlling the conveyor belt 304. Generally, the solar cell will spend less than a minute in the illumination/annealing section 310 and definitely less than 5 minutes. Cooling elements 314 allow actively cooling the solar cell 306 during annealing from a temperature in the range of 200° C.-300° C. to a temperature at least 50° C. lower with a cooling rate of at least 10° C./s.

Examples of commercial manufacturing in-line tools that may be used to perform the process use electronically controlled fans as cooling elements 314. The overall temperature profile in the illumination/annealing section 310 is directly related to the interaction between the infra-red lamps 316, the LED lamps 302 and the cooling elements 314.

The apparatus 300 of FIG. 3 allows for in-line processing of heterojunction solar cells using low cost light sources such as LEDs. Alternative processing apparatus can be used to perform the method which employ laser light sources. Alternative apparatus may also not be configured in-line and process solar cells one time by taking each individual cell to an illumination stage, for example using a robotic arm, illuminating the cell using a laser, and moving the cell from the illumination stage, possibly by using the same robotic arm. In this instance, active cooling can be provided using a flow of compressed air.

The person skilled in the art would appreciate that other alternative configurations of apparatus can also be envisaged.

The methodology outlined in FIG. 2 allows improving several parameters of the n-type heterojunction solar cell including the series resistance, surface passivation and/or open circuit voltage.

Figure 4:
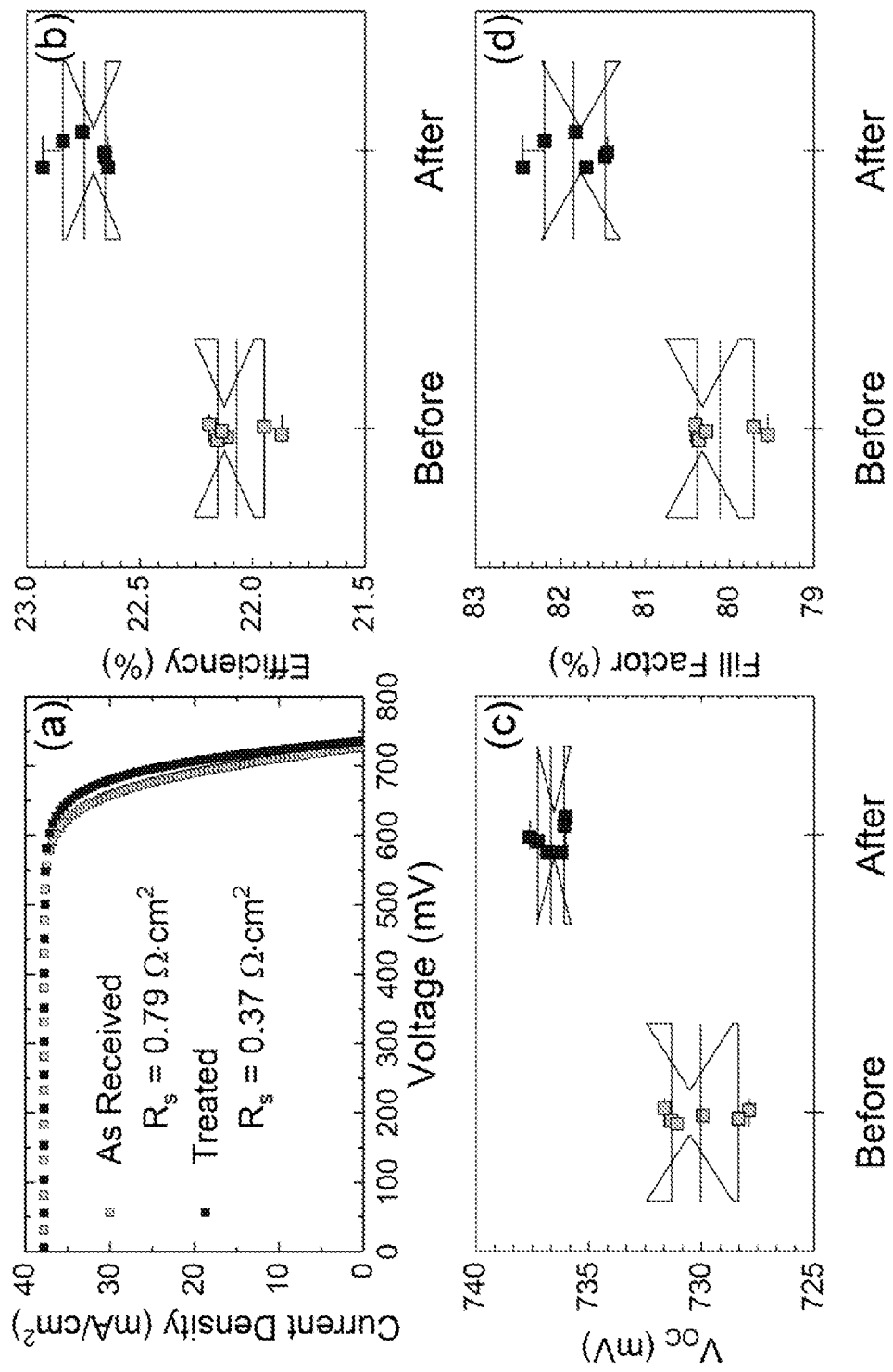
FIG. 4 shows electrical measurement results outlining the improvement in performance.

FIG. 4 shows current density-voltage characteristics of an individual cell before and after the treatment (a). The inset shows the change in area normalized $R_S$. Box plots depicting the change in efficiency (b), open circuit voltage (c) and fill factor (d).

The cells used to measure the data shown in FIG. 4 were fabricated in an industrial environment and had a structure in accordance with FIG. 1. Importantly, the cells were bifacial, 156 mm×156 mm with 5 busbars.

The one sun current-voltage (I-V) measurements were taken using a Wavelabs Sinus 220 before and after the multifunctional process. Photoluminescence (PL) images were obtained using a BT imaging LIS-R3 luminescence imaging tool before and after the post-cell process. The same tool was used to generate the series resistance mapping. The area-normalised series resistance values were calculated using the Suns-$V_{OC}$ method, whereby the maximum power-point voltage is compared between the Suns-$V_{OC}$ and 1 sun I-V data.

Right after fabrication, the industrial cells underwent a process in accordance with embodiments if the invention. Table 1 displays the process on the average photovoltaic performance values. The efficiency was shown to improve by 0.7% absolute; as shown in the notched box plot of FIG. 4(b).

TABLE 1

Average photovoltaic characteristics of industrial cells before and after treatment

| Cell Type | $V_{oc}$ (mV) | $J_{sc}$ (mA/cm$^2$) | FF (%) | Efficiency (%) |
|---|---|---|---|---|
| As Received | 730 ± 1.4 | 37.75 ± 0.06 | 80.1 ± 0.3 | 22.05 ± 0.12 |
| Treated | 737 ± 0.6 | 37.73 ± 0.06 | 81.9 ± 0.4 | 22.75 ± 0.11 |
| Average Change | +7 ± 1.5 | −0.02 ± 0.08 | +1.8 ± 0.4 | +0.7 ± 0.16 |

No statistically significant change in short circuit current density ($J_{SC}$) was observed and it is postulated that the efficiency enhancement was related to changes in both the $V_{OC}$ and Fill Factor (FF).

Figure 5:
FIG. 5 shows open-circuit photoluminescence (PL) images of industrial cells before (a) and after (b) the method of FIG. 2 is performed on the cells.
Figure 5:
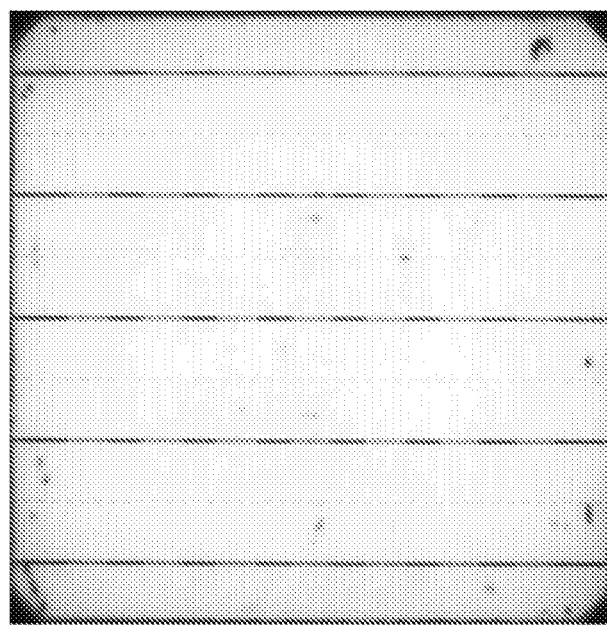
Figure 5:
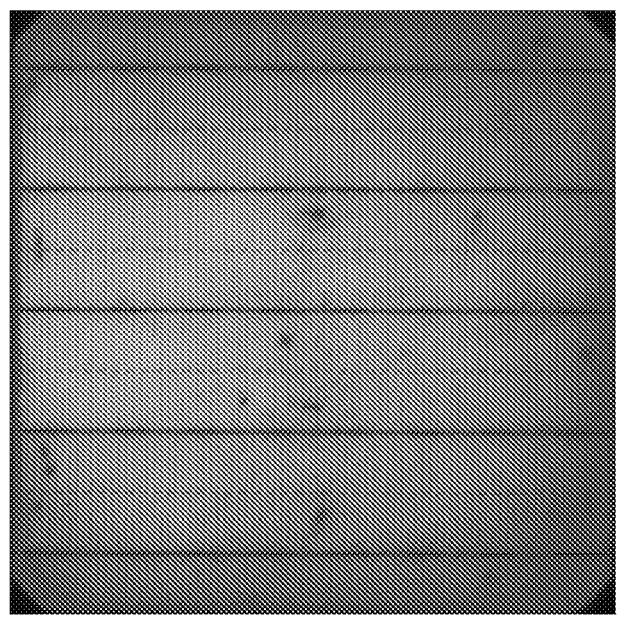

Referring now to FIG. 5, there are shown open-circuit PL images of industrial cells (a) before and (b) after the treatment. The images were taken using an illumination intensity of 0.5 suns.

A significant increase in the PL counts is observed, which matches the increase in $V_{OC}$. This image provides evidence that the increased voltage is related to spatially uniform improvements across the cell. This increased PL intensity and implied $V_{OC}$ is likely caused by an improvement in the surface passivation. The identical process performed on heterojunction precursor lifetime structures indicates an improvement in the dark saturation current density by a factor of 2, confirming an improvement in surface passivation.

A significant improvement is also seen in the FF. As shown in FIG. 4(a), the process reduces the area normalised series resistance ($R_S$) from 0.79 Ω·cm$^2$ to 0.37 Ω·cm$^2$ for the most improved cell.

Figure 6:
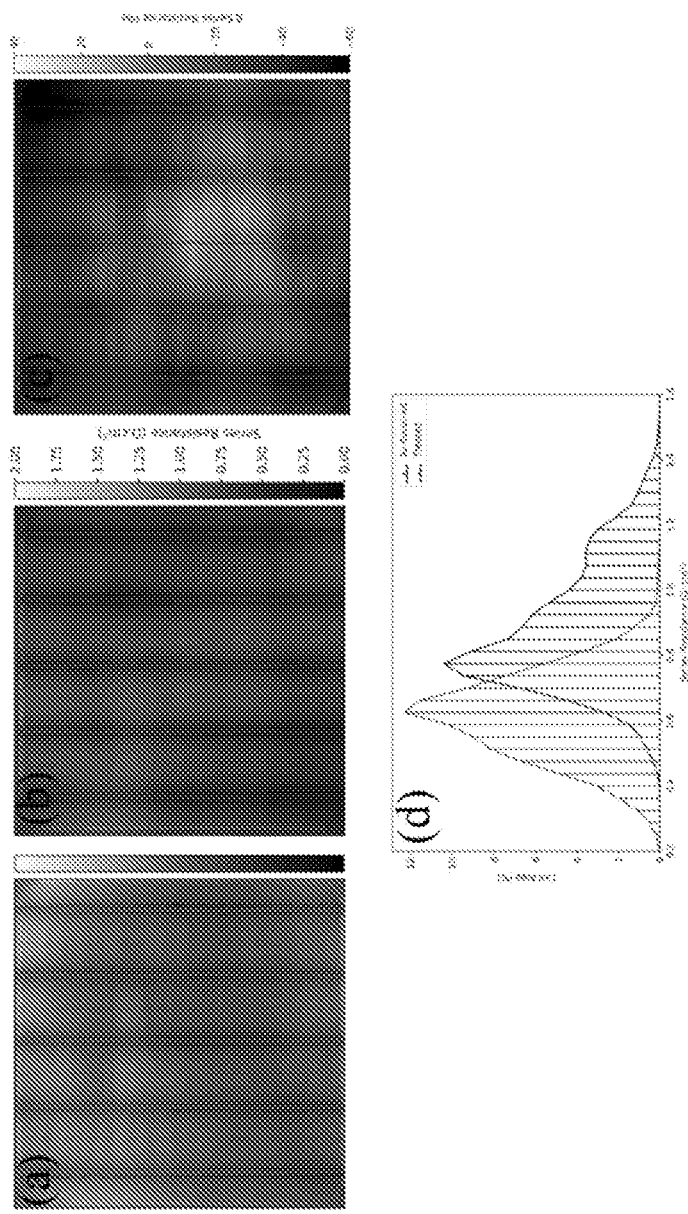
FIG. 6 shows series resistance mapping of industrial cells before and after the method of FIG. 2 is performed.

Referring now to FIG. 6, there are shown series resistance mapping of industrial cells before (a) and after (b) the method is performed. FIG. 6(c) shows an image displaying the percentage change in $R_S$ after the treatment. FIG. 6(d) is a histogram extracted from (a) and (b), depicting the spatial variation in $R_S$.

The spatial information about the resistance show a darker map after the annealing process is performed which is indicative of a reduction in $R_S$. FIG. 6(c) displays the relative percentage change in $R_S$ across the cell. The dark regions in this graph indicate a reduction in $R_S$. This shows that the $R_S$ decreases both in between the fingers and at the busbar. There is, however, a region in the middle of the cell where the $R_S$ is unchanged or may even have increased. The change in spatial variance in $R_S$ is depicted in the histogram in FIG. 6(d). According to the histogram, the process not only causes a reduction in the peak $R_S$, it also significantly reduces the spatial variance in $R_S$. A secondary peak seen in the as received cell at $R_S$>1.00 Ω·cm$^2$ disappears after the process is performed.

Figure 7:
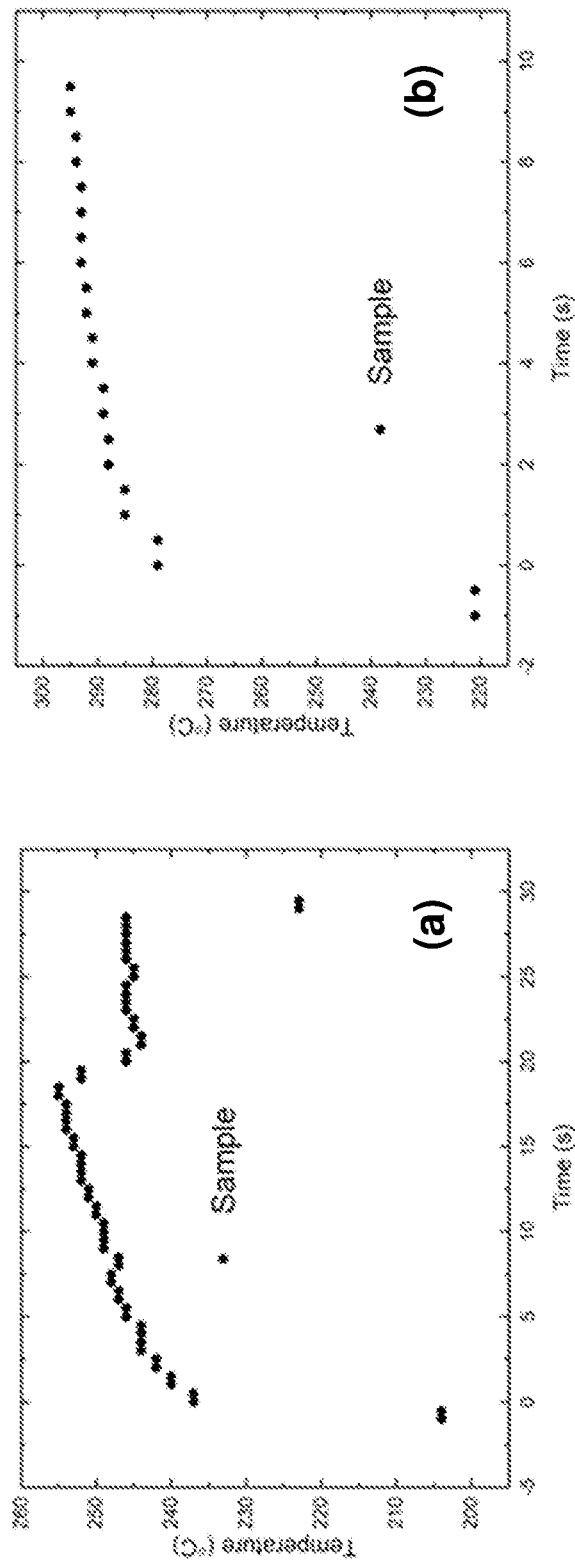
FIG. 7 shows temperature profiles used while performing the method of FIG. 2.
Figure 8:
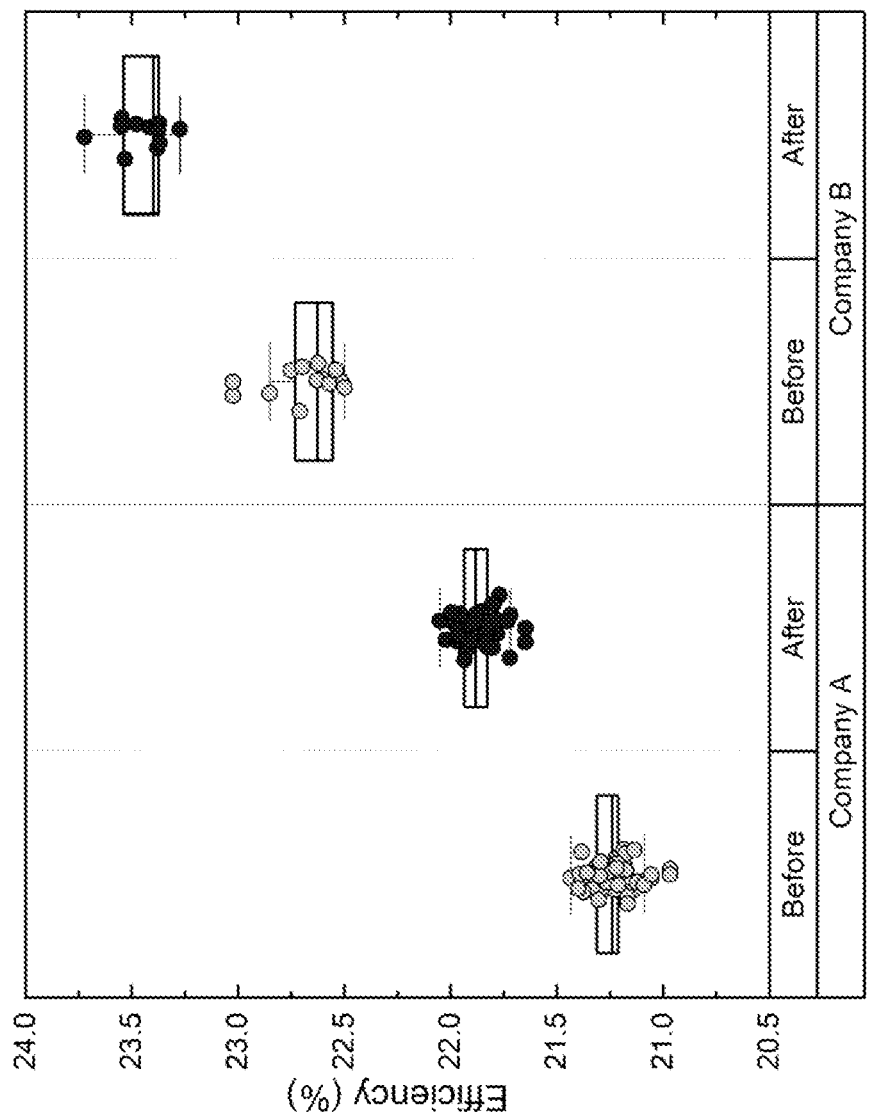
FIG. 8 shows an efficiency comparison for two different batches of solar cells before and after being treated using the method of FIG. 2.

FIGS. 7 and 8 show temperature profiles that were used while performing the illuminated anneal process of the cells used to obtain the measurement results shown in FIGS. 4 to 6.

The profiles in FIG. 7 clearly indicate that the improvements are achieved in a regime where the temperature of the cells exceeds 200° C. FIG. 7(a) shows the cell temperature profile for a 30 seconds illuminated annealing process using a laser source with a first temperature setting (200° C.) and FIG. 7(b) shows the cell temperature profile for a 10 seconds illuminated annealing process using a laser source with a second temperature setting (250° C.). The laser intensity used to illuminate the cells was approximately 100 suns or 100 kW/m$^2$.

In both cases the improved performance is obtained with cell temperatures well above the 200° C. threshold, in contrast with what is reported in the literature. A heating rate of that exceeds 10° C./s was experienced by the cells at the beginning of the illumination period.

FIG. 8 shows an efficiency comparison for two different batches of solar cells before and after being treated using the method of FIG. 2. It can be seen that, despite the different initial efficiency of the two types of cells, the treatment in this temperature regime effectively improves the cell performance. The improvement in performance obtained using the methodology of FIG. 2 was comparable for the two batches of cells and consistent across cells of the same batch.

Figure 9:
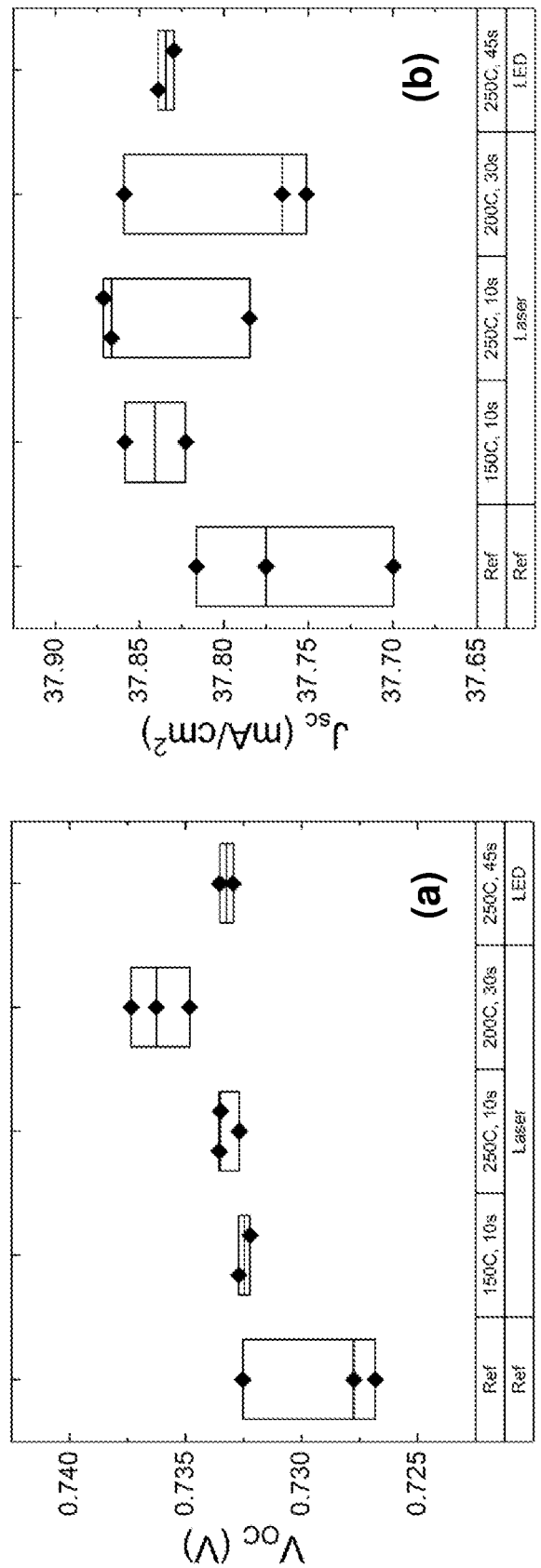
FIGS. 9 and 10 show electrical measurement results for solar cells treated using different embodiments of the method of FIG. 2.
Figure 10:
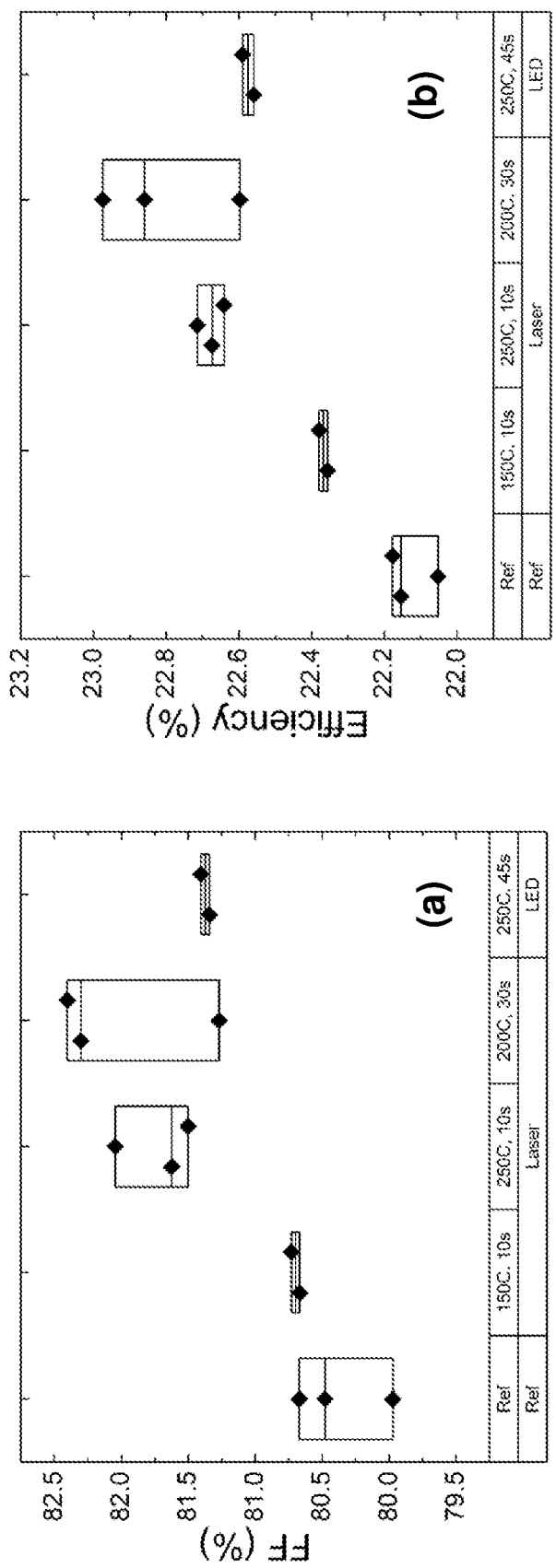

FIGS. 9 and 10 show electrical measurement results for industrial n-type silicon solar cells treated using different embodiments of the method of FIG. 2 using a laser-based apparatus and an LED based apparatus (last set of measurement points in the four plots of FIGS. 9 and 10). These results indicate increased fill factor and $V_{OC}$ is achieved for a variety of thermal conditions in the range of 200° C.-300° C. FIG. 10(b) indicates that the highest performance improvement occurs for the laser treatment with the setpoint temperature 200° C. This corresponds to the laser treatment with the thermal profile shown in FIG. 7(a).

The results outlined above with reference to FIGS. 4 to 10 relate to some embodiments of the methodology to improve the performance of n-type heterojunction cells disclosed herein. The technology is not limited to these embodiments. Other embodiments of the methodology are described in the examples below.

Example 1

A metallised n-type heterojunction solar cell is provided. Subsequently, the device is illuminated with an intensity of at least 2 kW/m$^2$ with photons with a wavelength between 500 nm and 1100 nm at a temperature between 200° C. and 300° C. to generate excess minority carriers in the solar cell for a period of less than 15 minutes, and the duration of the illuminated process is determined to ensure that a total energy flux of less than 0.5 kWh/m² of the said photons is delivered to the device. Subsequently, the device is cooled.

Example 2

A metallised n-type heterojunction solar cell is provided, whereby silver contacts have been formed using screen-printing of a metallisation paste, and the pastes have been cured at a certain temperature ($T_1$).

Optionally, the solar cell is pre-heated to a temperature higher than 100° C. using a temperature-controlled thermal mass in contact with the solar cell, whereby the temperature on the thermal mass is set with a temperature higher than 100° C.

Subsequently, the device is illuminated with an intensity of at least 5 kW/m² of photons with a wavelength of 800 nm-1000 nm using a laser source for a period of less than 15 minutes at a temperature of $T_2$ in the range of 200° C.-300° C., whereby the temperature is higher than temperature $T_1$ used to cure the metal pastes. The duration of the illuminated process is determined to ensure that a total energy flux of less than 0.5 kWh/m² of the said photons is delivered to the device. The illumination is used to generate excess carriers within the device with a concentration of more than $1 \times 10^{16}$/cm³.

During the illuminated process, the device is actively cooled using the thermal mass to limit the temperature of the device to less than 300° C.

Subsequently, the device is cooled from the said temperature $T_2$ in the range of 200° C.-300° C., to a temperature $T_3$ at least 50° C. lower than $T_2$, with a cooling rate of at least 10° C./s. This may be achieved by reducing the intensity of the illumination source or the complete removal of the illumination source. Cooling may also be achieved by removing the solar cell from the thermal mass after the removal of the illumination source. After the removal of the solar cell from the thermal mass, the solar cell may be further cooled by the use of air blowing across the surface of the solar cell, or by putting the solar cell in contact with another thermal mass at a temperature less than 200° C.

Example 3

A metallised n-type heterojunction solar cell is provided. Optionally, a full area rear metallisation layer is used.

The solar cell is moved into contact with a thermal mass at a set temperature of 250° C., and vacuum suction is used to provide a good thermal contact with the thermal mass.

Subsequently, the entire front surface of the device with an area of more than 200 cm² is illuminated simultaneously with an intensity of at least 50 kW/m² of photons with a wavelength between 800 nm and 1000 nm using a laser source for a period of less than 10 seconds.

During the illuminated process, the device is actively cooled using the thermal mass to limit the temperature of the device to less than 300° C.

Subsequently, the illumination source is removed from the solar cell. The solar cell is also removed from the heated thermal mass, and moved into contact with another thermal mass at a temperature below 200° C.

Example 4

A metallised n-type heterojunction solar cell is provided. The solar cell is moved into contact with a thermal mass at a set temperature of 250° C., and vacuum suction is used to provide a good thermal contact with the thermal mass.

Subsequently, the device is illuminated with an intensity of 50 kW/m²-100 kW/m² of photons with a wavelength between 800 nm and 1000 nm using a laser source for a period of less than 10 seconds.

During the illuminated process, the device is actively cooled using the thermal mass to limit the temperature of the device to less than 275° C.

Subsequently, the illumination source is removed from the solar cell. The solar cell is also removed from the heated thermal mass, and moved into contact with another thermal mass at a temperature below 200° C.

Example 5

A metallised n-type heterojunction solar cell is provided. The solar cell is moved onto a processing stage with a series of pins to minimise the thermal mass in contact with the solar cell. Subsequently, the device is illuminated with an intensity of at least 50 kW/m² of photons with a wavelength of 800 nm-1000 nm using a laser source. During the illuminated process, the temperature of the solar cell is monitored using an optical sensor. Subsequently, the illumination intensity is removed once the solar cell reaches a predetermined temperature in the range of 250° C.-300° C. Subsequently, air is blown across the surface of the solar cell to aid in the cooling of the device.

Example 6

A metallised n-type heterojunction solar cell is provided. The solar cell is moved onto a processing stage with a series of pins to minimise the thermal mass in contact with the solar cell. Subsequently, the device is illuminated with an intensity of at least 50 kW/m² of photons with a wavelength of 800 nm-1000 nm using a laser source. During the illuminated process, the temperature of the solar cell is monitored using an optical sensor. Subsequently, the illumination intensity is modulated to maintain a predetermined temperature in the range between 200° C. and 300° C. The duration of the process is determined to ensure a total energy flux of less than 0.5 kWh/m² is delivered to the device. Subsequently illumination is removed from the device, and air is blown across the surface of the solar cell to aid in the cooling of the device.

Example 7

A metallised n-type heterojunction solar cell is provided. The solar cell is then processed in a belt furnace conveyor with multiple zones, consisting of a heating zone, illuminated zone, and a cooling zone. Optionally, in the heating zone, infra-red lamps are used to heat the device to a temperature larger than 100° C. Subsequently, in the illuminated zone, the device is illuminated with an intensity of at 5 kW/m², at a temperature of 225° C. for a duration of less than 45 seconds. Optionally, cooling from fans is used to limit the heating of the solar cell during the illuminated zone. Optionally, this illuminated process is used to cure the metal paste on at least one of the surfaces of the solar cell.

The duration of the process and belt speed is determined to ensure a total energy flux of less than 0.5 kWh/m² is delivered to the device.

Subsequently the device is cooled in the cooling zone, with fans blowing air across the surface of the solar cell to result in cooling of more than 10° C./s.

It is to be understood that the terminology employed herein is used for the purpose of describing particular embodiments only and is not intended to be limiting since the scope of the disclosure will be limited only by the claims and equivalents thereof.

The invention claimed is:

1. A method for improving the performance of an n-type heterojunction solar cell comprising:
   providing a heterojunction solar cell; the solar cell having an n-type silicon substrate exclusively doped with n-type dopants with a concentration higher than $1\times10^{14}$ cm$^{-3}$ and a plurality of metallic contacts;
   illuminating a surface portion of the solar cell for a period of less than 5 minutes and at a temperature between 200° C. and 300° C. with light having an intensity of at least 2 kW/m$^2$ and a wavelength such that the light is absorbed by the surface portion and generates electron-hole pairs in the solar cell;
   wherein the step of illuminating a surface portion of the solar cell is such that less than 0.5 kWh/m$^2$ of energy is transferred to the surface portion and a temperature of the surface portion increases at a rate of at least 10° C./s for a period of time during illumination.

2. The method of claim 1, wherein the step of illuminating a surface portion of the solar cell with light is such that an excess carrier concentration within the solar cell is at least $1\times10^{16}$ cm$^{-3}$ during illumination.

3. The method of claim 1, wherein the wavelength of the light is such that absorption in the plurality of metallic contacts is higher than absorption in the silicon substrate.

4. The method of claim 1, further comprising varying the intensity of illumination to modulate the temperature of the device.

5. The method of claim 1, wherein the step of illuminating a surface portion of the solar cell is performed so that the exposed portion is rapidly heated to a pre-determined temperature by using a higher illumination intensity.

6. The method of claim 1, wherein:
   the illumination intensity is higher than 5 kW/m$^2$; or
   the illumination intensity is higher than 20 kW/m$^2$.

7. The method of claim 1, wherein:
   the illumination intensity is higher than 5 kW/m$^2$ for less than 6 minutes; or
   the illumination intensity is higher than 20 kW/m2 for less than 90 seconds.

8. The method of claim 1, wherein:
   the illumination intensity is higher than 100 kW/m$^2$ for less than 18 seconds; or
   the illumination intensity is higher than 200 kW/m$^2$ for less than 9 seconds.

9. The method of claim 1, wherein the illumination intensity is higher than 50 kW/m$^2$ for a period of time between 0.1 seconds and 9 seconds.

10. The method of claim 1, wherein:
    the wavelength of the light is between 700 nm and 1100 nm; or
    the wavelength of the light is between 800 nm and 1000 nm.

11. The method of claim 1, further comprising actively cooling the solar cell during illumination when the illumination intensity is above 4 kW/m$^2$.

12. The method of claim 1, further comprising actively cooling the solar cell from a temperature in the range of 200° C.-300° C. to a temperature at least 50° C. lower with a cooling rate of at least 10° C./s.

13. The method of claim 12, wherein the solar cell is cooled with a cooling rate of at least 20° C./s.

14. The method of claim 12, wherein the solar cell is cooled to a temperature below 150° C.

15. The method of claim 1, further comprising pre-heating the device to a temperature of at least 100° C. using infra-red light.

16. The method of claim 1, wherein:
    the step of illuminating a surface portion of the solar cell is performed at a temperature of 210° C.-295° C.; or
    the step of illuminating a surface portion of the solar cell is performed at a temperature of 220° C.-290° C.; or
    the step of illuminating a surface portion of the solar cell is performed at a temperature of 230° C.-280° C.; or
    the step of illuminating a surface portion of the solar cell is performed at a temperature of 240° C.-270° C.

17. The method of claim 1, wherein:
    the illuminated portion has an area of more than 10 cm$^2$; or
    the illuminated portion has an area of more than 100 cm$^2$.

18. The method of claim 1, wherein the illuminated portion comprises a rear surface of the device.

19. The method of claim 1, wherein the illuminated portion comprises a rear and a front surface of the device.

20. The method of claim 1, wherein:
    the step of illuminating a surface portion of the solar cell with light is performed at a temperature above 250° C. for a duration of less than 30 seconds; or
    the step of illuminating a surface portion of the solar cell with light is performed at a temperature above 250° C. for a duration of less than 10 seconds.

* * * * *